(12) United States Patent
Tseng et al.

(10) Patent No.: US 12,738,340 B2
(45) Date of Patent: Sep. 15, 2026

(54) FLASH MEMORY AND TESTING METHOD THEREOF

(71) Applicant: Winbond Electronics Corp., Taichung City (TW)

(72) Inventors: I-Hsien Tseng, Taichung City (TW); Lung-Chi Cheng, Taichung City (TW); Hsiu-Han Liao, Taichung City (TW)

(73) Assignee: Winbond Electronics Corp., Taichung City (TW)

( * ) Notice: Subject to any disclaimer, the term of this patent is extended or adjusted under 35 U.S.C. 154(b) by 137 days.

(21) Appl. No.: 18/969,275

(22) Filed: Dec. 5, 2024

(65) Prior Publication Data

US 2025/0191672 A1 Jun. 12, 2025

(30) Foreign Application Priority Data

Dec. 8, 2023 (TW) ................................ 112147822

(51) Int. Cl.
*G11C 29/56* (2006.01)
*G11C 16/34* (2006.01)
(Continued)

(52) U.S. Cl.
CPC .... *G11C 29/56004* (2013.01); *G11C 16/3436* (2013.01); *G11C 16/344* (2013.01); *G11C 16/3463* (2013.01); *G11C 16/3472* (2013.01); *G11C 29/022* (2013.01); *G11C 29/04* (2013.01); *G11C 29/38* (2013.01); *G11C 29/50* (2013.01); *G11C 29/56016* (2013.01); *G11C 2029/0403* (2013.01); *G11C 2029/5006* (2013.01)

(58) Field of Classification Search
CPC .......... G11C 29/56004; G11C 16/3436; G11C 16/344; G11C 16/3463; G11C 16/3472; G11C 29/022; G11C 29/04; G11C 29/38; G11C 29/50; G11C 29/56016; G11C 2029/0403; G11C 2029/5006
See application file for complete search history.

(56) References Cited

U.S. PATENT DOCUMENTS 6,684,173 B2 1/2004 Kessenich et al.
8,947,958 B2 2/2015 Mu et al.
(Continued)

*Primary Examiner* — Donald HB Braswell
(74) *Attorney, Agent, or Firm* — JCIPRNET

(57) ABSTRACT

A flash memory and a testing method thereof are provided. The testing method includes following steps: performing an erase verification reference value adjustment step, including adjusting a erase verification current from a normal erase verification current to a fast bit screening erase verification current, and adjusting a soft program verification current from a normal soft program verification current to a fast bit screening soft program verification current; performing an erase operation on memory cells in which the fast bit screening erase verification current is adopted to perform a corresponding erase verification; performing a soft program operation on the memory cells in which the fast bit screening soft program verification current is adopted to perform a corresponding soft program verification; and applying a test voltage to word lines coupled to the memory cells to determine whether the memory cells are defective memory cells or normal memory cells a obtained cell currents.

19 Claims, 6 Drawing Sheets

(51) Int. Cl.

| | |
|---|---|
| ***G11C 29/02*** | (2006.01) |
| ***G11C 29/04*** | (2006.01) |
| ***G11C 29/38*** | (2006.01) |
| ***G11C 29/50*** | (2006.01) |

(56) References Cited

U.S. PATENT DOCUMENTS

2011/0170358 A1* 7/2011 Chen .................. G11C 11/5628
365/201
2020/0051650 A1* 2/2020 Schatzberger ......... G11C 16/08
2020/0243143 A1* 7/2020 Liao .................... G11C 16/107

* cited by examiner

FLASH MEMORY AND TESTING METHOD THEREOF

CROSS-REFERENCE TO RELATED APPLICATION

This application claims the priority benefit of Taiwan application serial no. 112147822, filed on Dec. 8, 2023. The entirety of the above-mentioned patent application is hereby incorporated by reference herein and made a part of this specification.

BACKGROUND

Technical Field

The disclosure relates to a testing method of chips, and in particular to a testing method of a flash memory that can reduce the number of memory cells with characteristics of fast bits and low conductance and be applicable in a chip probing stage.

Description of Related Art

In the process of producing a flash memory, before the final packaging test, each of the chips in a wafer is tested to screen out defective chips. For example, a cell current of the memory cell may be tested by applying a test voltage to a word line coupled to the memory cell, and defective memory cells may be screened based on the magnitude of the cell current. Then, the defective memory cells can be repaired using redundant memory cells in the chip, thereby reducing the manufacturing cost of the chip.

However, for the defective memory cells with characteristics of fast bits and low conductance, the starting position of a bit line voltage that starts to generate the cell current is smaller, and the conductance slope formed by the bit line voltage and the cell current may also be smaller, causing the current-voltage curve thereof to intersect with the current-voltage curve of the normal memory cells under the usual test voltage, so it is difficult to screen out such defective memory cells.

With the miniaturization of flash memory, it is more difficult to screen out defective memory cells with fast bits and low conductance, resulting in a decline in the yield and quality of the flash memory.

SUMMARY

The disclosure provides a flash memory and a testing method thereof, which may improve the issue of poor screening efficiency of defective memory cells during conventional chip probing stage.

The testing method of the flash memory of the disclosure includes the following steps: performing an erase verification reference value adjustment step, including adjusting an erase verification current from a normal erase verification current to a fast bit screening erase verification current, and adjusting a soft program verification current from a normal soft program verification current to a fast bit screening soft program verification current, the fast bit screening erase verification current is greater than the normal erase verification current, and the fast bit screening soft program verification current is less than the normal soft program verification current; performing an erase operation on multiple memory cells in which the fast bit screening erase verification current is adopted to perform a corresponding erase verification; performing a soft program operation on the memory cells in which the fast bit screening soft program verification current is adopted to perform a corresponding soft program verification; and applying a test voltage to word lines coupled to the memory cells to determine whether the memory cells are defective memory cells or normal memory cells according to obtained cell currents.

The flash memory of the disclosure includes a flash memory array and a memory control circuit. The flash memory array includes the memory cells. The memory control circuit is coupled to multiple word lines, multiple bit lines, and multiple source lines of the flash memory array. The memory control circuit is configured to: adjust the erase verification current from the normal erase verification current to the fast bit screening erase verification current, and adjust the soft program verification current from the normal soft program verification current to the fast bit screening soft program verification current during the test, the fast bit screening erase verification current is greater than the normal erase verification current, and the fast bit screening soft program verification current is less than the normal soft program verification current; perform the erase operation on the memory cells in which the fast bit screening erase verification current is adopted to perform the corresponding erase verification on the memory cells; perform the soft program operation on the memory cells in which the fast bit screening soft program verification current is adopted to perform the corresponding soft program verification on the memory cells; and apply a test voltage to the word lines coupled to the memory cells to determine whether the memory cells are the defective memory cells or the normal memory cells according to the obtained cell currents.

Based on the above, the flash memory and the testing method thereof of the disclosure can ensure the screening of the defective memory cells with fast bits and low conductance effects during the chip probing stage, and reduce the testing time. In this way, the defective memory cell can be more easily screened out, thereby improving the repair rate and endurance of the chips and reducing the manufacturing costs of the chips.

To make the aforementioned more comprehensible, several embodiments accompanied with drawings are described in detail as follows.

DESCRIPTION OF THE EMBODIMENTS

Figure 1:
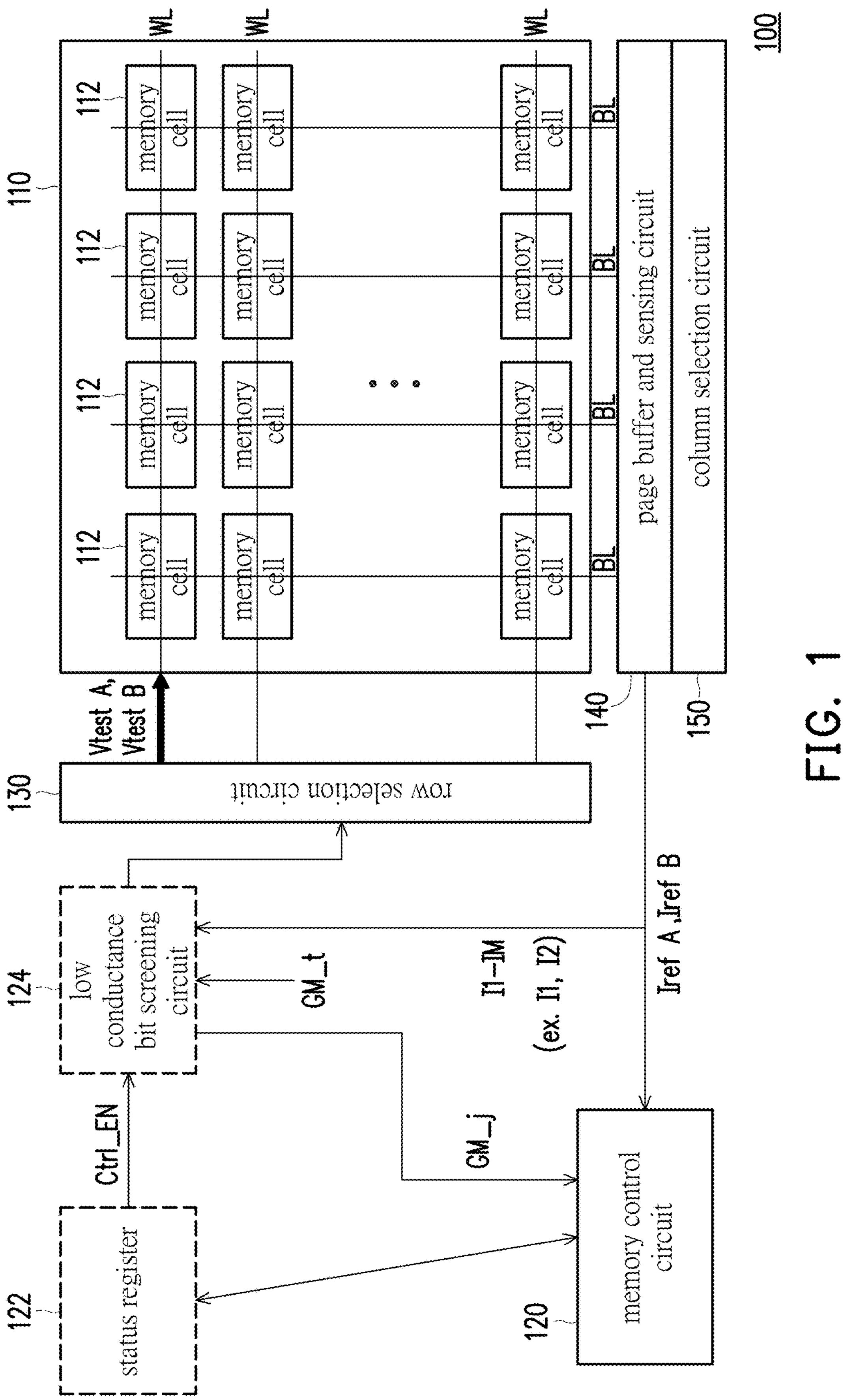
FIG. 1 is a schematic block diagram of a flash memory according to an embodiment of the disclosure.
Figure 2:
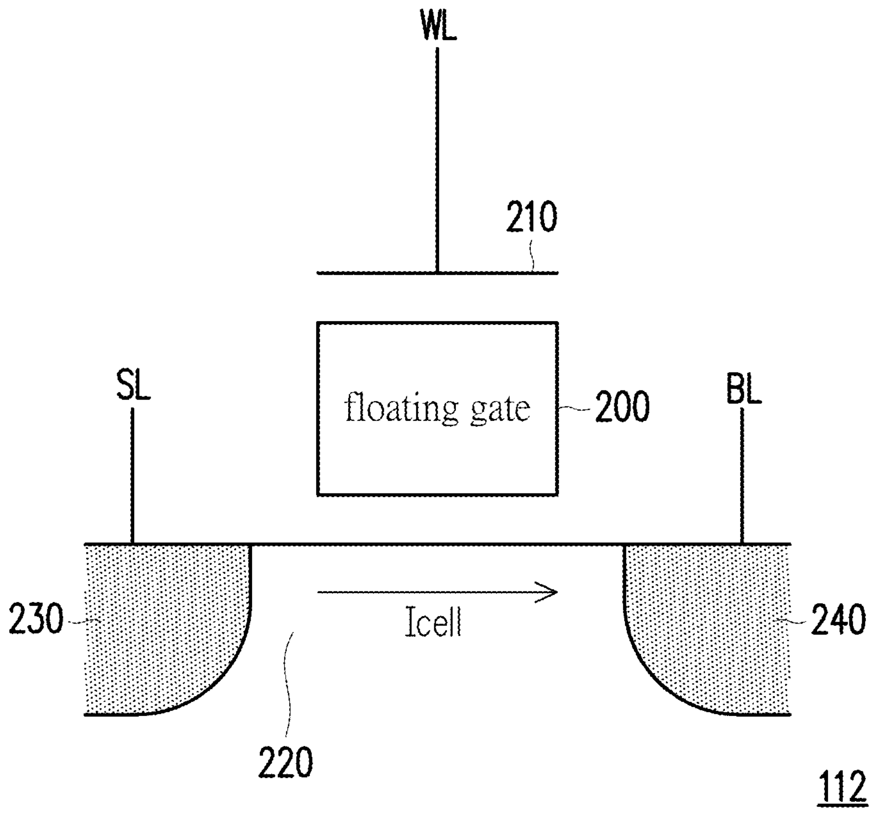
FIG. 2 is a schematic diagram of a memory cell of a flash memory according to an embodiment of the disclosure.

Referring to FIG. 1, a flash memory 100 includes a flash memory array 110, a memory control circuit 120, a row selection circuit 130, a page buffer and sensing circuit 140, and a column selection circuit 150. The flash memory array 110 includes multiple memory cells 112. Referring to FIG. 2, the memory cell 112 includes a floating gate 200, a control gate 210, a substrate 220, a source 230, and a drain 240. The control gate 210 is coupled to a corresponding word line WL. The source 230 is coupled to a corresponding source line SL. The drain 240 is coupled to a corresponding bit line BL. For example, when performing a program operation, according to a decode result of an address by the row selection circuit 130 and the column selection circuit 150, a program voltage may be applied to the selected word line WL and the bit line BL to change a potential of the corresponding floating gate 200. When performing an erase operation, according to the decode result of the address by the row selection circuit 130, an erase voltage may be applied to the selected word line WL to change the potential of the corresponding floating gate 200. Thereby, when performing a read operation, a reading voltage may be applied to the word line WL, and the potential of the floating gate 200 is determined through the page buffer and sensing circuit 140 according to a magnitude of a cell current Icell flowing through the source 230 and the drain 240 to obtain a logic value stored in the memory cell 112.

The memory control circuit 120, in addition to being, for example, a central processing unit or other programmable general-purpose or special-purpose microprocessors, a digital signal processor, a programmable controller, an application specific integrated circuit, a programmable logic device, or other similar devices or combinations thereof, may also be a hardware circuit designed through hardware description language or any other digital circuit design methods known to those of ordinary skill in the art, and implemented through methods such as a field programmable gate array or a complex programmable logic device.

Figure 3:
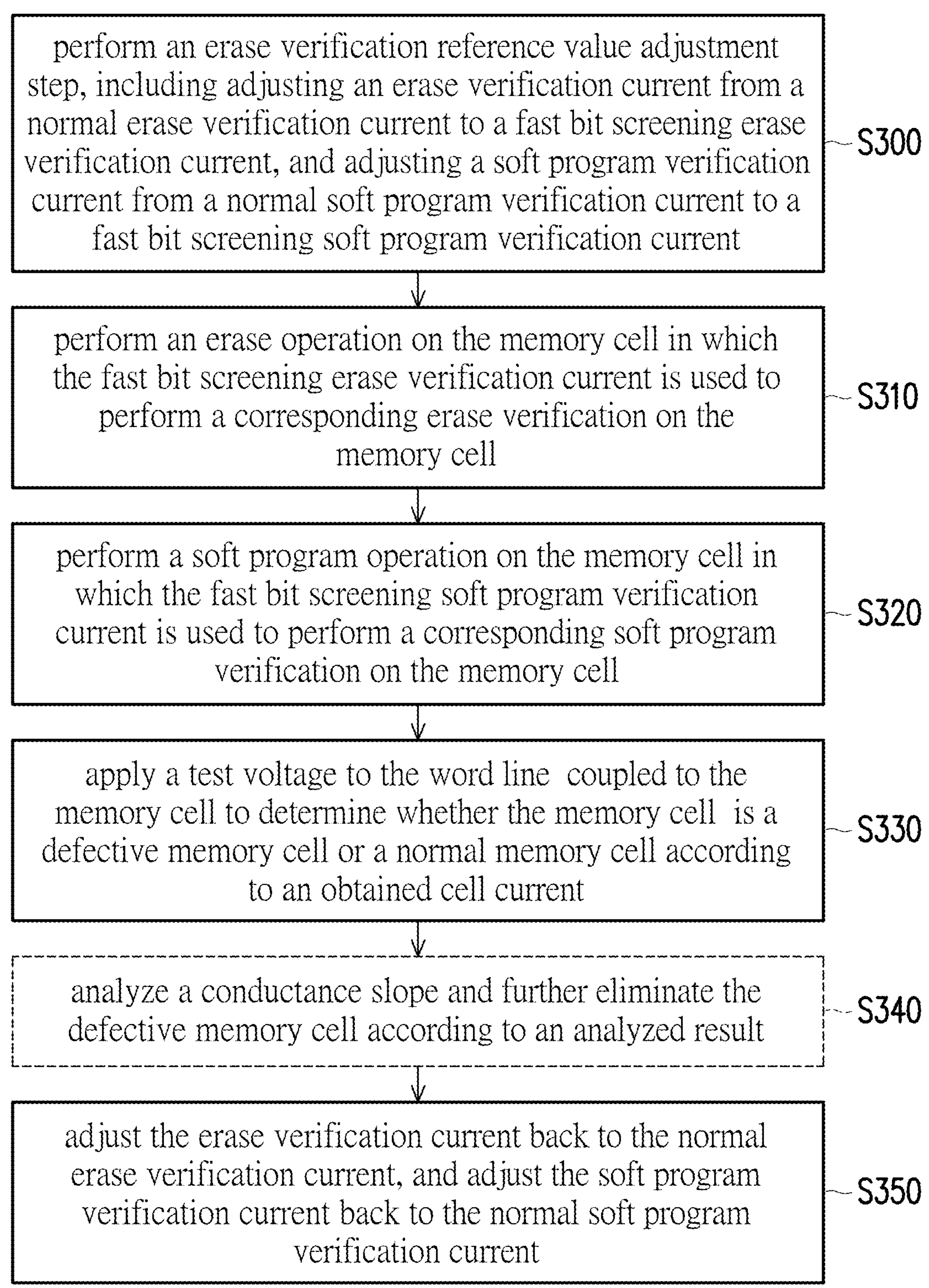
FIGS. 3, 4, and 6 are flow charts of steps of a testing method of a flash memory according to some embodiments of the disclosure.

Referring to FIG. 1 and FIG. 3 at the same time, a testing method of the flash memory of this embodiment is suitable for the flash memory 100 of FIG. 1 and is performed, for example, during a chip probing stage. First, an erase verification reference value adjustment step is performed by the memory control circuit 120, including adjusting an erase verification current from a normal erase verification current to a fast bit screening erase verification current, and adjusting a soft program verification current from a normal soft program verification current to a fast bit screening soft program verification current (step S300). The fast bit screening erase verification current is greater than the normal erase verification current; the fast bit screening soft program verification current is less than the normal soft program verification current. In an example, the fast bit screening erase verification current may be at least 1.25 times the normal erase verification current, but the disclosure is not limited thereto. In an example, the normal soft program verification current may be at least 1.5 times the fast bit screening soft program verification current, but the disclosure is not limited thereto.

Figure 4:
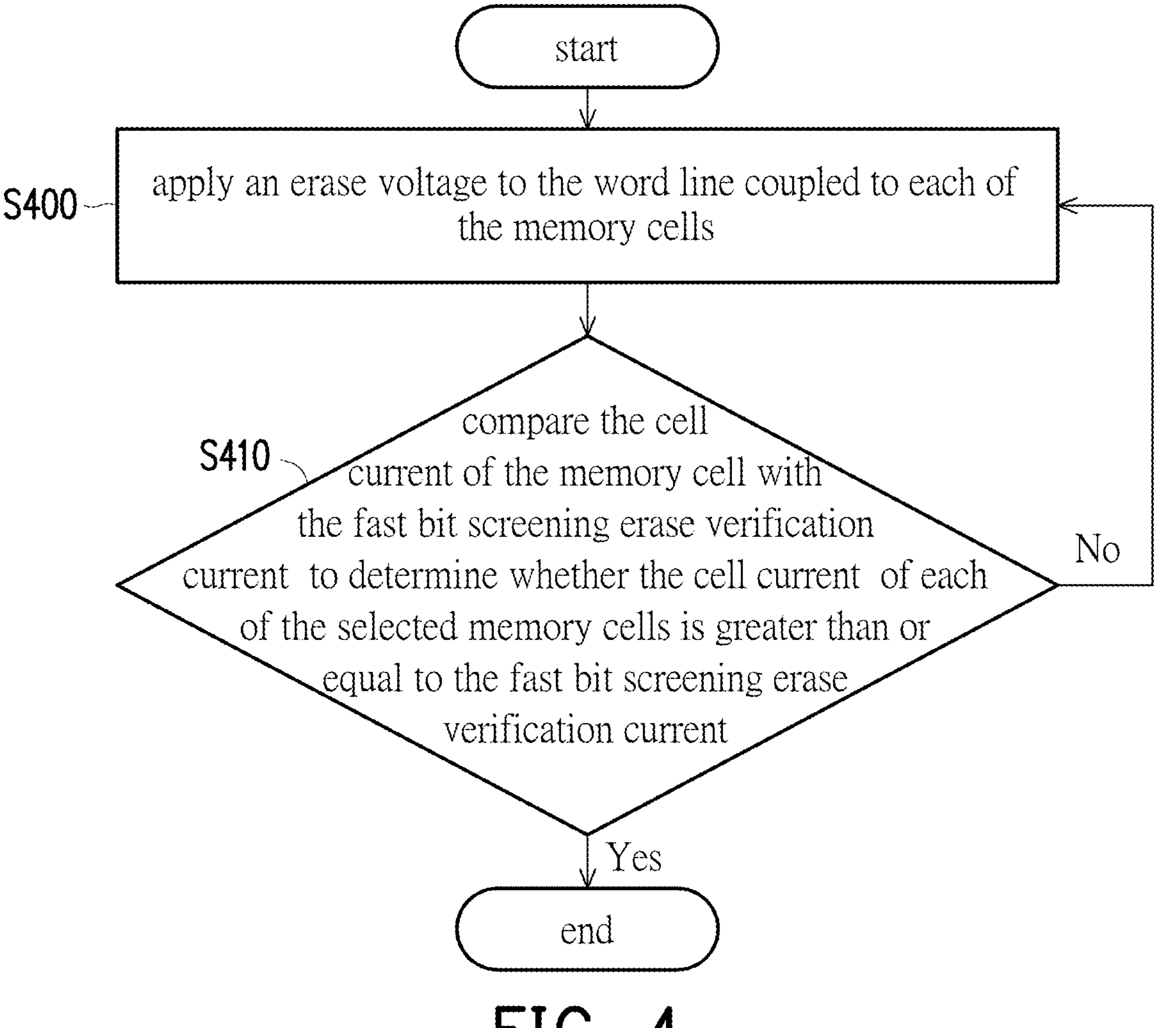

Then, the erase operation on the memory cell 112 in the flash memory array 110 is performed by the memory control circuit 120 in which the fast bit screening erase verification current is used to perform a corresponding erase verification on the memory cell 112 (step S310). In detail, referring to FIG. 1 and FIG. 4, the erase operation includes step S400 and step S410. In the step S400, the erase voltage is applied to the word line WL coupled to each of the memory cells 112 by the memory control circuit 120. Next, in the step S410, the cell current Icell of the memory cell 112 may be compared with the fast bit screening erase verification current by the memory control circuit 120 to determine whether the cell current Icell of each of the selected memory cells 112 is greater than or equal to the fast bit screening erase verification current. If so, the memory control circuit 120 may end the erase operation. On the contrary, when the cell current Icell of anyone (or a predetermined number) memory cell 112 of the selected memory cells 112 is less than the fast bit screening erase verification current, the step S400 is returned to until the cell currents Icell of all memory cells 112 reach the fast bit screening erase verification current.

Next, a soft program operation on the memory cell 112 in the flash memory array 110 is performed by the memory control circuit 120 in which the fast bit screening soft program verification current is used to perform a corresponding soft program verification on the memory cell 112 (step S320). Specifically, in an example of the soft program operation, firstly, a soft program voltage is applied to the word line WL and the bit line BL coupled to each of the memory cells 112 by the memory control circuit 120. Then, the cell current Icell of the memory cell 112 may be compared with the fast bit screening soft program verification current by the memory control circuit 120 to determine whether the cell currents Icell of all the memory cells 112 are less than or equal to the fast bit screening soft program verification current. If so, the memory control circuit 120 may end the soft program operation. On the contrary, when the cell current Icell of anyone (or a predetermined number) memory cell 112 of the selected memory cells 112 is greater than the fast bit screening soft program verification current, the memory control circuit 120 may apply the soft program voltage again and end the soft program operation.

Through the steps S300 to S320, it is possible to avoid the overlap of the current-voltage curves formed by the bit line voltage and cell current of defective memory cells with fast bit and low conductance with the current-voltage curve of normal memory cells. This makes it easier to identify defective memory cells with fast bit and low conductance.

Figure 5A:
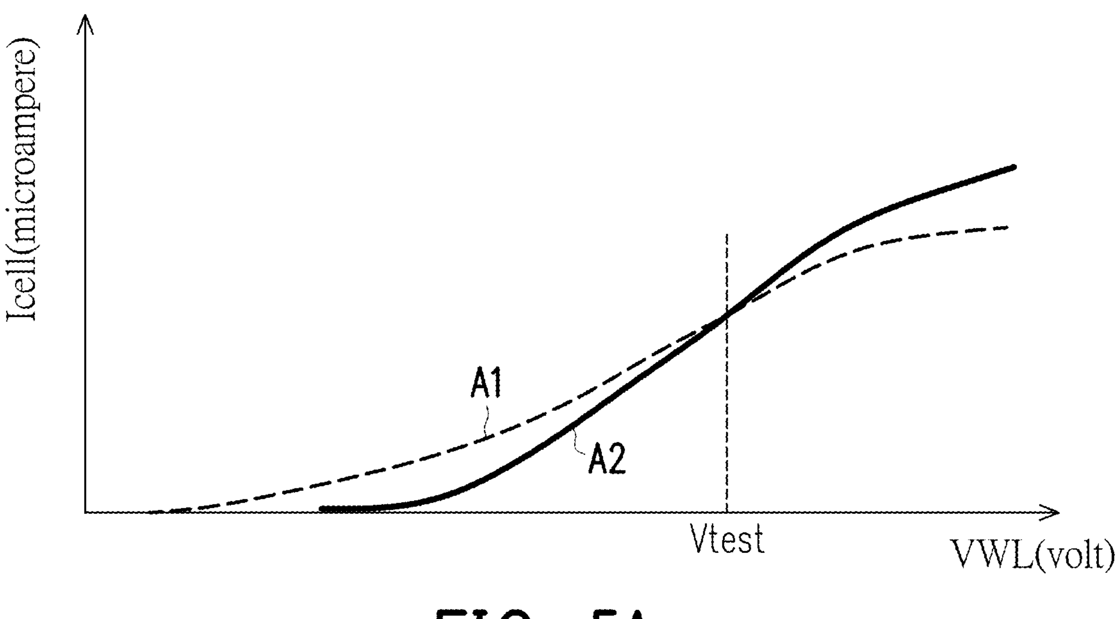
FIG. 5A is an example of a current-voltage curve obtained using the related art.
Figure 5B:
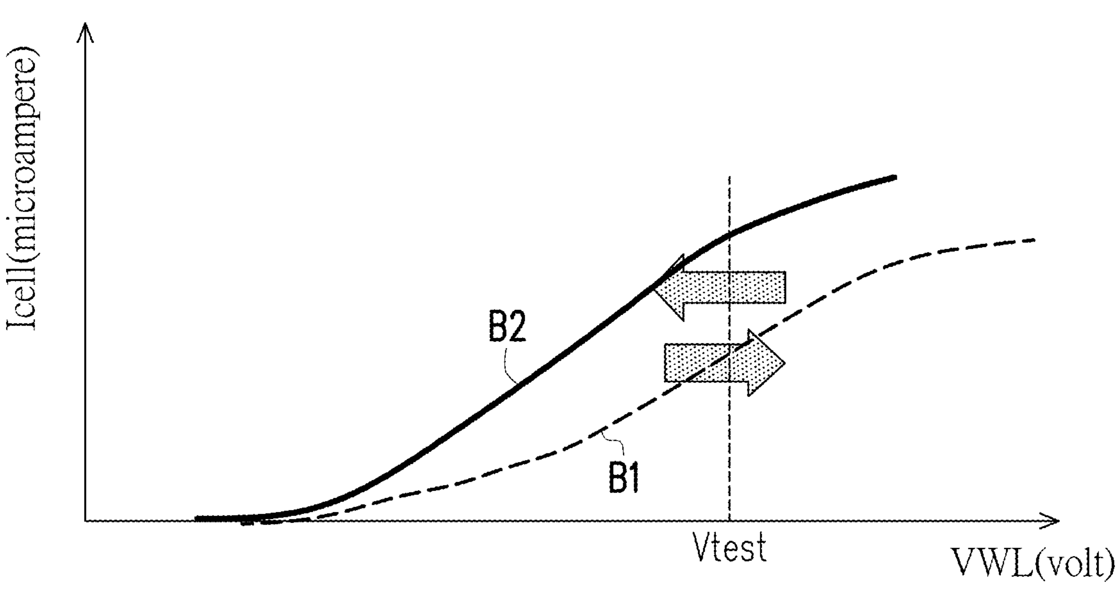
FIGS. 5B and 7 are examples of current-voltage curves according to some embodiments of the disclosure.

As shown in FIG. 5A and FIG. 5B, a horizontal axis represents a word line voltage VWL (unit: volt) of the memory cell, and a vertical axis represents the cell current Icell (unit: microampere) of the memory cell. As a control group according to an embodiment of the disclosure, FIG. 5A shows a current-voltage curve diagram without performing the steps S300 to S320. FIG. 5B shows the current-voltage curve after performing the steps S300 to S320.

In FIG. 5A, a current-voltage curve A1 of the defective memory cell with the fast bits and the low conductance effects and a current-voltage curve A2 of the normal memory cell are shown. As shown in FIG. 5A, when the word line voltage is a test voltage Vtest, the current-voltage curves A1 and A2 intersect. Therefore, it is difficult to use the cell current Icell to distinguish the defective memory cells from the normal memory cells, and screening may not be carried out smoothly.

In contrast, in FIG. 5B, a current-voltage curve B1 of the defective memory cell with the fast bits and the low conductance effects and a current-voltage curve B2 of the normal memory cell are shown. As shown in FIG. 5B, the current-voltage curves B1 and B2 are shifted compared to the current-voltage curves A1 and A2 in FIG. 5A (as indicated by the arrows in the figure). When the word line voltage is the test voltage Vtest, the current-voltage curves B1 and B2 do not intersect, so the cell current Icell may be used to distinguish the defective memory cells from the normal memory cells, and the screening may be carried out smoothly.

Please return to FIG. 3. In step S330, the test voltage is applied to the word line WL coupled to the memory cell 112 by the memory control circuit 120 to screen the memory cell 112 according to the obtained cell current Icell. Specifically, when the cell current Icell is greater than or equal to a predetermined threshold, the memory control circuit 120 determines that the tested memory cell 112 is the normal memory cell; otherwise, determining as the defective memory cell.

Figure 6:
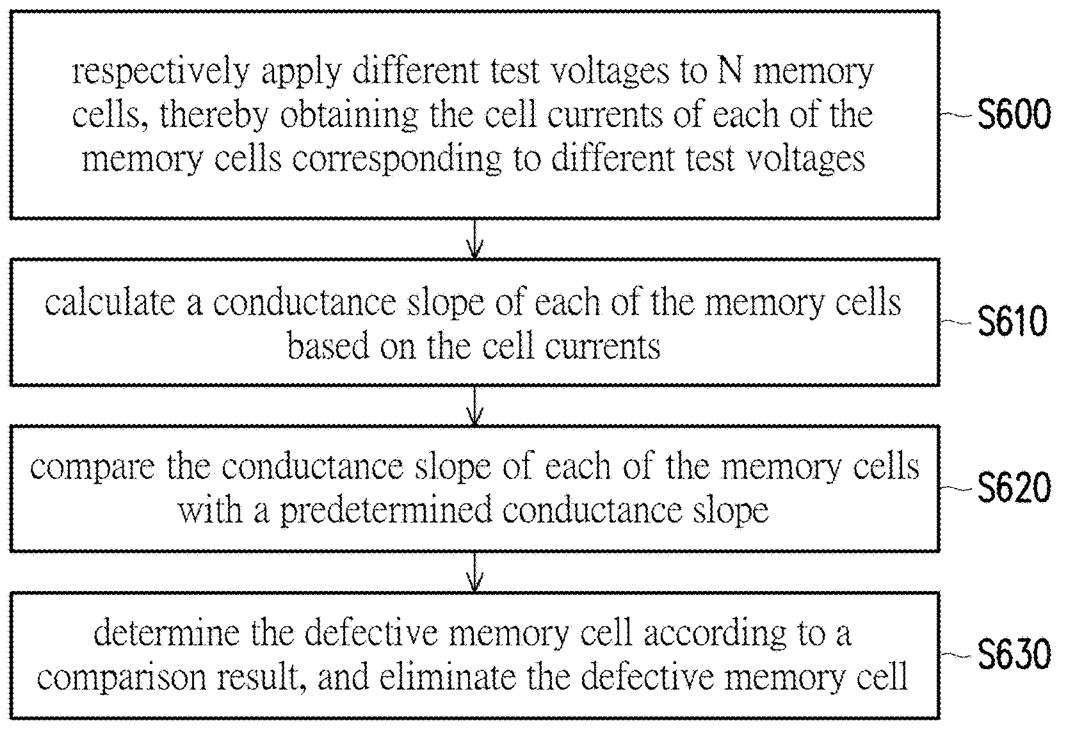
Figure 7:
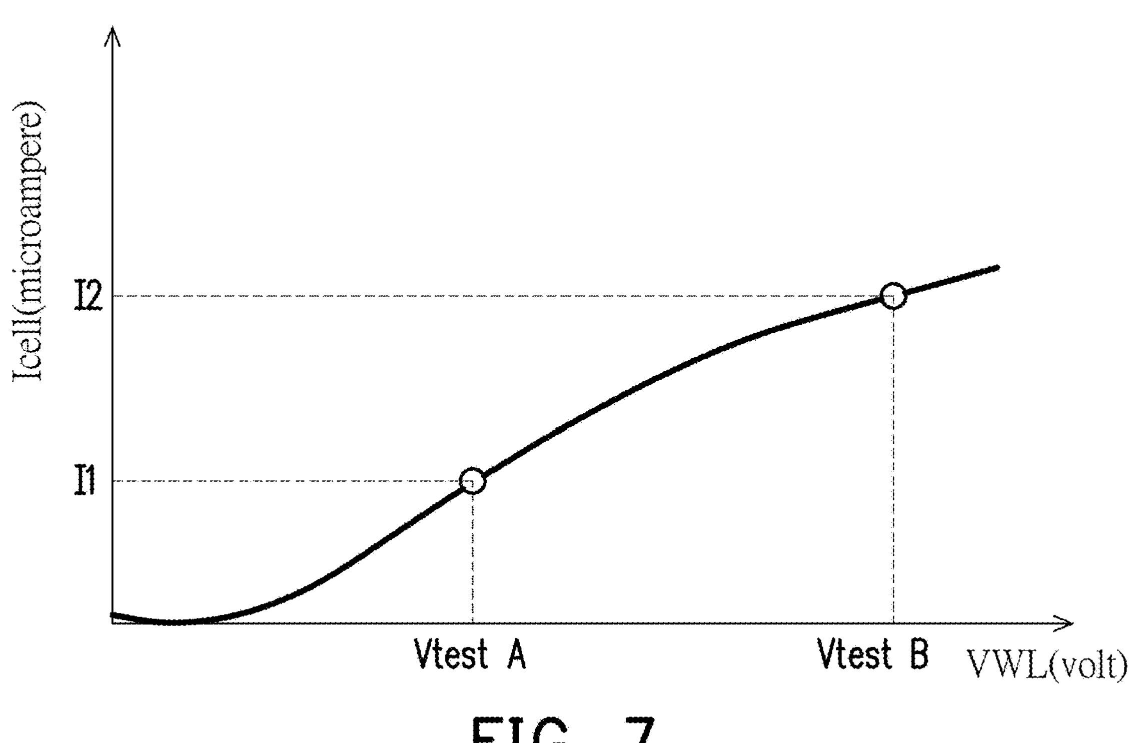

Optionally, the testing method of the flash memory of the disclosure further includes step S340, which involves analyzing a conductance slope of the selected memory cell 112 and further eliminating the defective memory cell according to the analyzed result to improve the quality of the flash memory. FIG. 6 shows the detailed flows of the step S340, and FIG. 7 shows an execution result of FIG. 6. In FIG. 7, the horizontal axis represents the word line voltage VWL applied to the selected memory cell, and the vertical axis represents the cell current Icell read from the selected memory cell.

Referring to FIG. 1, FIG. 6, and FIG. 7, M different test voltages Vtest may be respectively applied to N memory cells 112 in the flash memory array 110 by the memory control circuit 120, thereby obtaining M cell currents I1 to IM of each of the memory cells 112 corresponding to M different test voltages Vtest (step S600). In an embodiment, the flash memory 100 may further include a status register 122 and a low conductance bit screening circuit 124 respectively coupled to the memory control circuit 120. The status register 122 is configured to determine whether to enable the low conductance bit screening circuit 124 and output an enable control signal Ctrl_EN to the low conductance bit screening circuit 124. For example, the status register 122 may determine whether a test time is less than a predetermined value, and when the test time is less than the predetermined value, output the enable control signal Ctrl_EN for enabling the low conductance bit screening circuit 124.

The low conductance bit screening circuit 124 of this embodiment is coupled to the row selection circuit 130 and the page buffer and sensing circuit 140. For example, in an embodiment in which N is 1000 and M is 2, when the low conductance bit screening circuit 124 is enabled, the row selection circuit 130 may be controlled to respectively apply a first voltage Vtest A (for example, 3V) and a second voltage Vtest B (for example, 7V) to 1000 memory cells 112 in the flash memory array 110. Then, a first cell current I1 and a second cell current I2 corresponding to each of the memory cells 112 are read from each of the memory cells 112 through the page buffer and sensing circuit 140.

Then, a conductance slope GM_c of each of the memory cells 112 may be calculated by the low conductance bit screening circuit 124 based on the cell currents I1 to IM (step S610). The conductance slope GM_c of each of the memory cells 112 is, for example, equal to a difference between the first cell current I1 and the second cell current I2 divided by the first cell current I1.

Next, the conductance slope GM_c of each memory cell 112 may be compared with a predetermined conductance slope GM_t by the low conductance bit screening circuit 124 (step S620). Specifically, since the conductance slope of the defective memory cells with the fast bits and the low conductance effects is less, the low conductance bit screening circuit 124 may determine whether the conductance slope GM_c of each of the memory cells 112 is less than the predetermined conductance slope GM_t, and output a comparison result GM_j to the memory control circuit. Then, the memory cell with the conductance slope GM_c being less than the predetermined conductance slope GM_t may be determined as the defective memory cells by the memory control circuit and be eliminated (step S630). Thereby, the memory control circuit 120 may further ensure that the remaining normal memory cells have the predetermined conductance slope GM_t, and prevent the flash memory 100 from having the defective memory cells with the low conductance effects.

In an embodiment, the memory control circuit 120 may apply the first test voltage Vtest A and the second test voltage Vtest B to the normal memory cells, and read a first current reference value Iref A and a second current reference value Iref B from the normal memory cells through the page buffer and sensing circuit 140. Then, the predetermined conductance slope GM_t is calculated according to the first current reference value Iref A and the second current reference value Iref B.

In an embodiment, the testing method of the flash memory of the disclosure may classify each of the memory cells based on the comparison results of the first cell current I1 and the first current reference value Iref A and the comparison results of the second cell current I2 and the second current reference value Iref B of each of the memory cells. For example, when the first cell current I1 of the memory cell 112 is greater than the first current reference value Iref A, and the second cell current I2 is less than the second current reference value Iref B, the memory cell 112 is determined to have the characteristics of fast bits and low conductance, and is determined as defective memory cells, thereby being eliminated. When the first cell current I1 of the memory cell 112 is greater than the first current reference value Iref A, and the second cell current I2 is greater than the second current reference value Iref B, the memory cell 112 is determined to have the characteristics of fast bits and normal conductance, and is determined as defective memory cells, thereby being eliminated or taken no action. When the first cell current I1 of the memory cell 112 is less than the first current reference value Iref A, and the second cell current I2 is less than the second current reference value Iref B, the memory cell 112 is determined to have the characteristics of slow bit, and is determined as the defective memory cells, thereby being eliminated. When the first cell current I1 of the memory cell 112 is less than the first current reference value Iref A, and the second cell current I2 is greater than the second current reference value Iref B, the memory cell 112 is determined to have the characteristics of slow bit and high conductance, and is taken no action. The above classification may be performed by the memory control circuit 120 or an appropriate logic circuit, but the disclosure is not limited thereto.

In an embodiment, after the step S330, the testing method of the flash memory of the disclosure may further include step S350. In the step S350, the erase verification current may be adjusted from the fast bit screening erase verification current back to the normal erase verification current by the memory control circuit 120, and the soft program verification current is adjusted from the fast bit screening soft program verification current back to the normal soft program verification current for subsequent testing and processing such as data retention.

In summary, the flash memory and the testing method thereof of the disclosure can ensure the screening of the defective memory cells with the fast bits and the low conductance effects during the chip probing stage, and reduce the testing time. In this way, the defective chip may be prevented from being missed during the screening of chips, thereby improving the repair rate and the endurance of the chips and reducing the manufacturing cost of the chips.

In addition, the flash memory and the testing method thereof of the disclosure facilitate miniaturization to increase a total number of dies on a wafer. Therefore, the disclosure can reduce production cost and energy consumption for manufacturing a single IC, and reduce production energy consumption of subsequent packaging, thereby reducing carbon emissions in the flash memory manufacturing process. In addition, since the reliability and the endurance of the flash memory of the disclosure are improved, the disclosure provides a green semiconductor technology.

What is claimed is:

1. A testing method of a flash memory, wherein the flash memory comprises a plurality of memory cells, and the testing method comprises:

performing an erase verification reference value adjustment step, comprising adjusting an erase verification current from a normal erase verification current to a fast bit screening erase verification current, and adjusting the soft program verification current from a normal soft program verification current to a fast bit screening soft program verification current, wherein the fast bit screening erase verification current is greater than the normal erase verification current, and the fast bit screening soft program verification current is less than the normal soft program verification current;

performing an erase operation on the plurality of memory cells, and performing a corresponding erase verification on the plurality of memory cells by adopting the fast bit screening erase verification current;

performing a soft program operation on the plurality of memory cells, and performing a corresponding soft program verification on the plurality of memory cells by adopting the fast bit screening soft program verification current; and applying a test voltage to a word line coupled to the plurality of memory cells to determine whether the plurality of memory cells are defective memory cells or normal memory cells according to obtained cell currents.

2. The testing method of the flash memory according to claim 1, wherein performing the corresponding erase verification on the plurality of memory cells by adopting the fast bit screening erase verification current comprises;

determining whether the cell currents of the plurality of memory cells are greater than or equal to the fast bit screening erase verification current;

applying an erase voltage to the word line coupled to each of the plurality of memory cells again in response to the cell current of one of the plurality of memory cells being less than the fast bit screening erase verification current; and repeating determining and applying the erase voltage until the cell currents of the plurality of memory cells all reach the fast bit screening erase verification current.

3. The testing method of the flash memory according to claim 1, wherein performing the corresponding soft program verification on the plurality of memory cells by adopting the fast bit screening soft program verification current comprises;

determining whether the cell currents of the plurality of memory cells are less than or equal to the fast bit screening soft program verification current; and applying the soft program voltage to the word line and a bit line coupled to each of the plurality of memory cells again in response to the cell current of one of the plurality of memory cells being greater than the fast bit screening soft program verification current.

4. The testing method of the flash memory according to claim 1, further comprising; analyzing a conductance slope of the plurality of memory cells, and further eliminating the defective memory cell according to an analyzed result.

5. The testing method of the flash memory according to claim 4, wherein analyzing the conductance slope of the plurality of memory cells and further eliminating the defective memory cell according to the analyzed result comprises;

respectively applying a plurality of different test voltages to N memory cells, thereby obtaining a plurality of cell currents of each of the plurality of memory cells corresponding to the plurality of different test voltages;

calculating the conductance slope of each of the plurality of memory cells according to the plurality of cell currents;

comparing the conductance slope of each of the plurality of memory cells with a predetermined conductance slope; and determining the defective memory cell according to a comparison result, and eliminating the defective memory cell.

6. The testing method of the flash memory according to claim 5, further comprising applying a first test voltage and a second test voltage to the normal memory cell, and calculating the predetermined conductance slope according to a first current reference value and a second current reference value read from the normal memory cell.

7. The testing method of the flash memory according to claim 6, wherein the plurality of cell currents comprises a first cell current and a second cell current, and the testing method further comprises comparing the comparison result of the first cell current of each of the plurality of memory cells and the first current reference value with the comparison result of the second cell current of each of the plurality of memory cells and the second current reference value to classify each of the plurality of memory cells.

8. The testing method of the flash memory according to claim 7, wherein classifying each of the plurality of memory cells comprises:

determining the plurality of the memory cells to have characteristics of fast bits and low conductance in response to the first cell current of the plurality of memory cells being greater than the first current reference value and the second cell current being less than the second current reference value, and determining the plurality of memory cells as the defective memory cell, thereby eliminating thereof.

9. The testing method of the flash memory according to claim 8, wherein classifying each of the plurality of memory cells further comprises:

determining the plurality of the memory cells to have the characteristics of fast bits and normal conductance in response to the first cell current of the plurality of memory cells being greater than the first current reference value, and the second cell current being greater than the second current reference value, and determining the plurality of memory cells as the defective memory cell, thereby eliminating thereof or taking no action.

10. The testing method of the flash memory according to claim 9, wherein classifying each of the plurality of memory cells further comprises:

determining the plurality of the memory cells to have the characteristics of slow bits in response to the first cell current of the plurality of memory cells being less than the first current reference value, and the second cell current being less than the second current reference value, and determining the plurality of memory cells as the defective memory cell, thereby eliminating thereof.

11. The testing method of the flash memory according to claim 10, wherein classifying each of the plurality of memory cells further comprises:

determining the plurality of the memory cells to have the characteristics of slow bits and high conductance in response to the first cell current of the plurality of memory cells being less than the first current reference value and the second cell current being greater than the second current reference value, and taking no action.

12. The testing method of the flash memory according to claim 1, wherein after applying the test voltage to the word lines coupled to the plurality of memory cells, further comprises;

adjusting the erase verification current from the fast bit screening erase verification current back to the normal erase verification current, and adjusting the soft program verification current from the fast bit screening soft program verification current back to the normal soft program verification current.

13. A flash memory, comprising:

a flash memory array, comprising a plurality of memory cells; and a memory control circuit, coupled to a plurality of word lines, a plurality of bit lines, and a plurality of source lines of the flash memory array, wherein the memory control circuit is configured to:

adjust an erase verification current from a normal erase verification current to a fast bit screening erase verification current, and adjust a soft program verification current from a normal soft program verification current to a fast bit screening soft program verification current during a test, wherein the fast bit screening erase verification current is greater than the normal erase verification current, and the fast bit screening soft program verification current is less than the normal soft program verification current;

perform an erase operation on the plurality of memory cells, and perform a corresponding erase verification on the plurality of memory cells by adopting the fast bit screening erase verification current;

perform a soft program operation on the plurality of memory cells, and perform a corresponding soft program verification on the plurality of memory cells by adopting the fast bit screening soft program verification current; and apply a test voltage to the plurality of word lines coupled to the plurality of memory cells to determine whether the plurality of memory cells are defective memory cells or normal memory cells according to obtained cell currents.

14. The flash memory according to claim 13, wherein the memory control circuit is further configured to:

determine whether the cell currents of the plurality of memory cells are greater than or equal to the fast bit screening erase verification current during the erase operation;

apply an erase voltage to the word line coupled to each of the plurality of memory cells again in response to the cell current of one of the plurality of memory cells being less than the fast bit screening erase verification current; and repeat determining and applying the erase voltage until the cell currents of the plurality of memory cells all reach the fast bit screening erase verification current.

15. The flash memory according to claim 13, wherein the memory control circuit is further configured to:

determine whether the cell currents of the plurality of memory cells are less than or equal to the fast bit screening soft program verification current during the soft program operation; and apply a soft program voltage to the word line and the bit line coupled to each of the plurality of memory cells again in response to the cell current of one of the plurality of memory cells being greater than the fast bit screening soft program verification current.

16. The flash memory according to claim 13, further comprising:

a low conductance bit screening circuit, coupled to the memory control circuit, wherein the low conductance bit screening circuit is configured to analyze the conductance slope of the plurality of memory cells in response to the low conductance bit screening circuit being enabled, and further eliminate the defective memory cell according to an analyzed result; and a status register, coupled to the memory control circuit and the low conductance bit screening circuit, wherein the status register is configured to determine whether to enable the low conductance bit screening circuit, and output an enable control signal to the low conductance bit screening circuit.

17. The flash memory according to claim 16, wherein the low conductance bit screening circuit is configured to control to respectively apply a plurality of different test voltages to the N memory cells, thereby obtaining a plurality of cell currents of each of the plurality of memory cells corresponding to the plurality of different test voltages, calculate the conductance slope of each of the plurality of memory cells according to the plurality of cell currents, compare the conductance slope of each of the plurality of memory cells with a predetermined conductance slope, and determine the defective memory cell according to a comparison result and eliminate the defective memory cell.

18. The flash memory according to claim 17, wherein the memory control circuit is configured to apply a first test voltage and a second test voltage to the normal memory cell, and calculate the predetermined conductance slope according to a first current reference value and a second current reference value read from the normal memory cell.

19. The flash memory according to claim 17, wherein the memory control circuit is configured to adjust the erase verification current from the fast bit screening erase verification current back to the normal erase verification current, and adjust the soft program verification current from the fast bit screening soft program verification current back to the normal soft program verification current after determining the plurality of memory cells as the defective memory cell or the normal memory cell.

* * * * *